(12) United States Patent
Gerlach et al.

(10) Patent No.: US 7,326,087 B2
(45) Date of Patent: Feb. 5, 2008

(54) PLUG-IN CONNECTOR AND COUPLING IN THE FORM OF AN RJ45 CONNECTOR JACK

(75) Inventors: Bernd Gerlach, Darmstadt (DE);
Reinhard Feltgen, Höngen (DE);
Frans Oudshoorn, Stolzenau (NL)

(73) Assignee: TKM Telekommunikation und Elektronik GmbH (DE)

( * ) Notice: Subject to any disclaimer, the term of this patent is extended or adjusted under 35 U.S.C. 154(b) by 0 days.

(21) Appl. No.: 11/591,444

(22) Filed: Oct. 31, 2006

(65) Prior Publication Data

US 2007/0105452 A1 May 10, 2007

(30) Foreign Application Priority Data

Nov. 2, 2005 (EP) ................... 05023843

(51) Int. Cl.
*H01R 24/00* (2006.01)
(52) U.S. Cl. .................. 439/660; 385/53; 385/88; 439/676
(58) Field of Classification Search ........... 439/660, 439/676, 638; 385/53, 88, 139
See application file for complete search history.

(56) References Cited

U.S. PATENT DOCUMENTS

| | | | | |
|---|---|---|---|---|
| 5,896,480 | A * | 4/1999 | Scharf et al. ............. | 385/88 |
| 6,364,535 | B1 | 4/2002 | Coffey | |
| 6,718,099 | B2 * | 4/2004 | Chivers .................... | 385/52 |
| 6,802,653 | B2 * | 10/2004 | Deane ...................... | 385/88 |
| 6,832,856 | B2 * | 12/2004 | Chiu et al. ............... | 385/53 |
| 7,147,519 | B2 * | 12/2006 | Reichle ................... | 439/676 |
| 7,194,183 | B2 * | 3/2007 | Thornton et al. .......... | 385/139 |
| 7,217,043 | B2 * | 5/2007 | Schunk .................... | 385/94 |
| 7,234,879 | B2 * | 6/2007 | Schrodinger ............. | 385/89 |
| 2005/0118880 | A1 | 6/2005 | Reichle | |

FOREIGN PATENT DOCUMENTS

| | | |
|---|---|---|
| DE | 20202835 | 3/2003 |
| EP | 1211537 | 6/2002 |
| EP | 1258759 | 11/2002 |
| WO | 03016972 | 2/2003 |

\* cited by examiner

*Primary Examiner*—Michael C. Zarroli
(74) *Attorney, Agent, or Firm*—Thomas M. Freiburger

(57) ABSTRACT

Proposed is a plug-in connector incorporating an RJ45 connection jack for a data transmission cable (2), said cable being especially a hybrid cable with at least one light transmission conductor (7, 8) and associated therewith also parallel aligned electrical conductors (12). In accord with the invention, the housing contains a connection block (11), which is box-like in shape and which is equipped with at least two openings for the insertion of at least two light conductors (7, 8), one circuit board (18) with connection elements (23) for the joining of the electrical conductor (12) of the hybrid data cable, whereby the circuit board (18) can be mechanically connected to one side of the connection block. The circuit board contains parallel arranged contact paths (19) which are accessible by means of the of open recesses (9) of one of the connection blocks, and the circuit board as well as the given auxiliary casing which surrounds the connection block (11). This arrangement also allows the connection of electrical elements which are yet to be attached. The invention concerns also a complementary plug-in coupling similarly constructed.

18 Claims, 3 Drawing Sheets

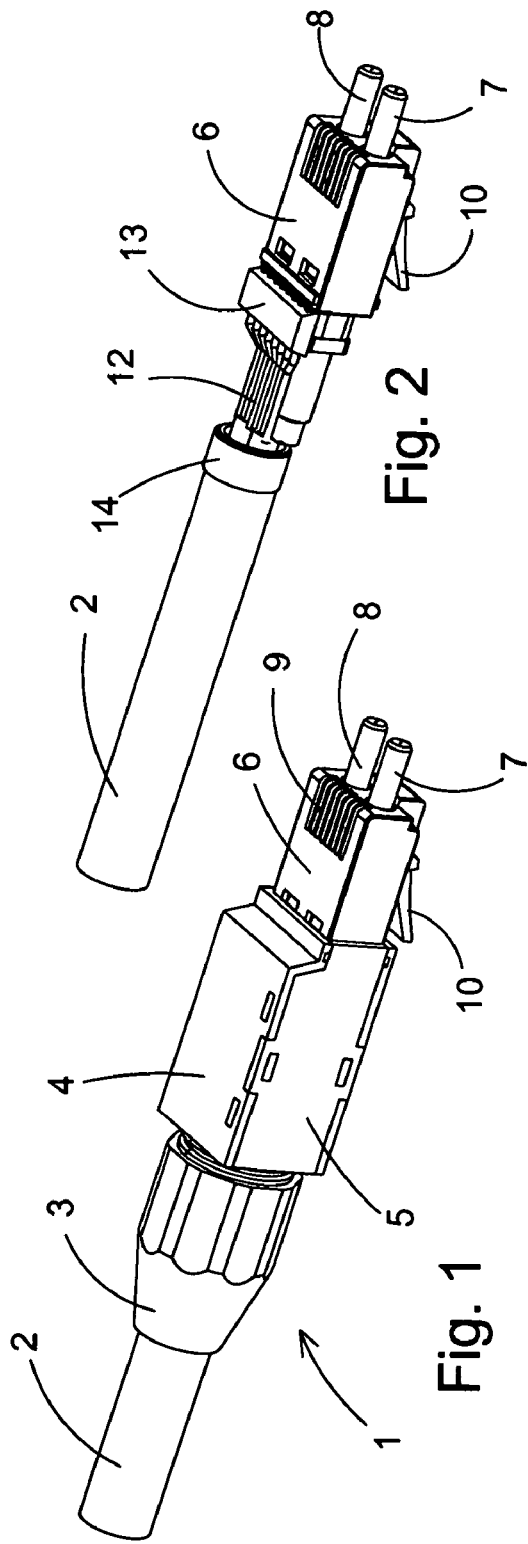
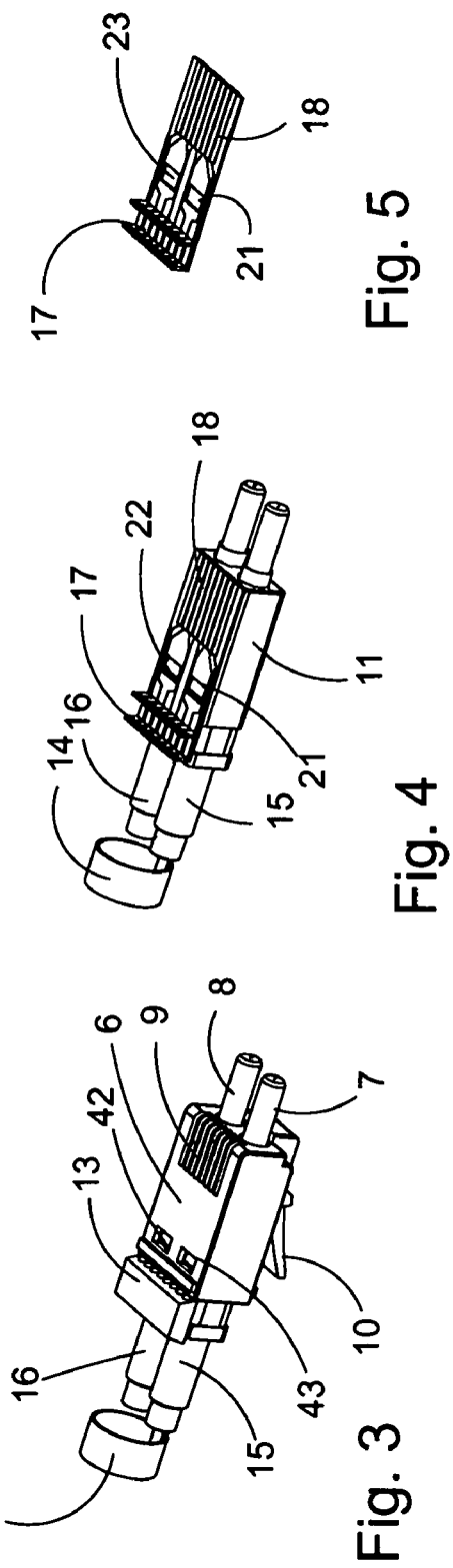

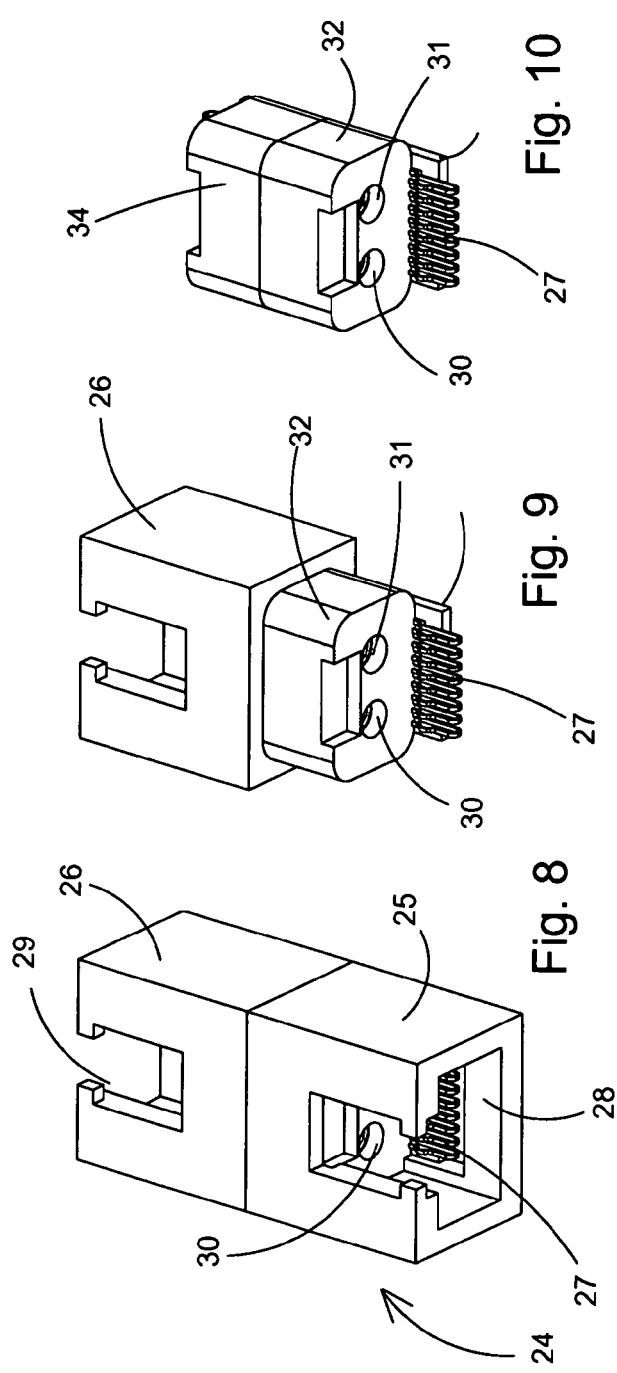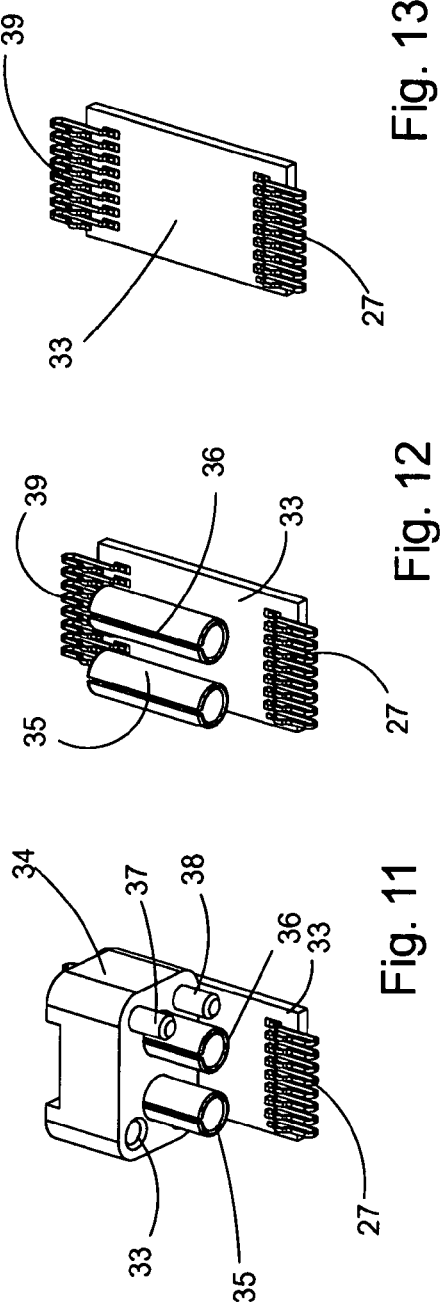

PLUG-IN CONNECTOR AND COUPLING IN THE FORM OF AN RJ45 CONNECTOR JACK

BACKGROUND AND SUMMARY OF THE INVENTION

The invention concerns a plug-in connector incorporating an RJ45 connector jack for electrical and light transmission, which especially relates to hybrid cable applications, as stated in the principal concept of claim 1, and also concerns a complementary plug-in coupling also employing the RJ45 connector jack in accordance with the principal concept of claim 9.

Plug-in connectors for modern data transmission technology are usually designed either as electrical plug-in connectors with RJ45 connector jacks or a light conductor, generally having ends terminating in RJ45 connector jacks.

In networks of mixed construction, it is possible that not only electrical lines but also light conductors may be installed, so that a great need has been created in such networks for cable connections that are appropriate for both electrical and light transmissions.

Hybrid cables are known which accept, within a common outer enclosure, conductors respectively designed for transmission of light as well as electrical current. Typically, the employed conductor terminals lead to separate plug-in connectors.

DE 203 17 751 discloses a plug-in arrangement for the manufacture of an optical, plug-in connector for an optical cable, wherein an RJ45 connector jack is employed. In this case a coupling sleeve is provided, into which the RJ45 equipped plug can be inserted, by means of which the optical transmission means, i.e. the light transmitting fibers, can be coupled with each other. The housing body has borings to receive the ends of the optical fibers, wherein contiguous fibers, enclosed in a ceramic shell, can confront one another in essentially a face to face manner.

EP 1 199 587 teaches a connection system for a hybrid cable, which has optical fibers running parallel along electrical conductors, both of which can be connected to corresponding conductors in a common, insertable plug. In this case the underside of the plug has electrical contacts which can communicate with spring clamp contacts on the forward end of a connector bushing. The bushing may be mounted on a circuit board. The fastening of the conductor onto the plug is, in any case, done in a customary manner.

The invention has the purpose of making available a plug-in connector incorporating an RJ45 connector jack, which is adaptable to serve as an electrical and optical transmission cable. This is true, in particular, when used with a hybrid cable which enables a high immunity to noise interference and can also carry a plurality of optical fibers.

This purpose is achieved by the invention as defined in claims 1 and 9. Additional features of the invention are described in subordinate claims.

The invention in accord with claim 1 concerns a plug-in connector employing an RJ45 connector jack for a data transmission cable having at least one light conductor line as well as electrical lines running parallel thereto, and having further a terminal for an end of the light conductor line and in addition, electrical contacts. The described assembly of optical and electric contacts (hereinafter referred to as "connection block") has an auxiliary housing for protection of both contacts.

By means of such a plug-in connector, combinations of electrical and optical cables, especially combined as a hybrid data cable, can be brought into a contacting union with a complementary female coupling, or with an appropriate bushing, whereby, by means of the insertion of conducting projections into the corresponding bushing both an electrical and an optical data transfer can be made.

In accord with the invention, an auxiliary housing of the plug-in connector encases a said connection block, which has a positioning detent for itself (and its assembly) and said connection block is relatively box-like in its assembly. This connection block has at least two penetrative openings for receiving at least two light conductors. A circuit board designed for a data transmission cable carries attachment facilities for the electrical conductors. The circuit board can be connectedly attached on one end of the connection block and contains parallel arranged contact tracks which make themselves available through penetrative openings at one end of the connection block and the encasing auxiliary housing. The auxiliary housing protects the connective assembly of the conductive wires of electrical connectors which are part of the connection block.

A plug-in connector of this type is obviously assembled from individual components which are simple to manufacture and capable of being easily fitted together. However, in the final assembled state of the components, a robust, precise plug-in connector is created, which fulfills all professional requirements for its functioning. Receptive, penetrative openings therein for the guidance of light conductors permit an exact structure for light transmission advantageously allowing the least possible loss of energy from transmitted light. The electrical contacts are simultaneously protected in their arrangement and enable a precise positioning of the contacting wires.

Advantageously, circuit boards possess blade type clamps for the joining of the electrical conductors of the cable. The connection and the securement of the electrical conductors to the blade-clamp connection is advantageously carried out by the use of a pressure block, which fits in an axial transverse direction over the blade connections, thus enabling the assurance of quick and secure contacting.

Advantageously, the employed auxiliary housing is furnished with openings to accommodate mechanical positioning detents of the connection block. An auxiliary housing serves first, for the protection of the electrical connections, second, to furnish openings for the penetrating connections wiring of an input bushing to be attached thereto. The locking system of the positioning detents also holds the plug-in connector properly aligned with its connections from the bushing.

To enhance the securement of the light conduction means, penetrations into the connection block can be protected by inserted cylindrical shells of plastic, metal or ceramic material.

The housing of the plug-in connector is advantageously composed of a plurality of parts, whereby the individual components of the plug-in unit housing can be properly interlocked together. By means of a threadedly tightened cable clamp fitting on the rear side of the housing (rear being to the left as seen in the drawing), it becomes possible to affix a combination cable or a hybrid cable securely to the plug-in connector.

In a further embodiment, provision can be made that the circuit board be molded as a component of the connection block or be alternatively welded, adhesively affixed, or secured by retaining detents therewith.

The invention concerns also a plug-in coupling employing the RJ45 connector jack to accommodate the insertion of two data cables, especially hybrid cables, with respectively at least one light conductor and therewith electric conductors which are run parallel thereto, with connection blocks for the ends of the light conductor fibers and for the electrical contact, all secured in a two-part coupling housing. Such plug-in couplings serve the purpose of connecting two provided cables with end to end plug-in contacts, which, among other advantages, allow increasing cable length.

In accord with the invention, the plug-in coupling also possesses a box like circuit assembly, wherein two circuits are combined to present two complementary faces confrontingly opposite one another. The two circuit assemblies, with the aid of aligned axially parallel bores, are to be joined together for the reception of and the arrangement of light conductors. Externally, and extending beyond the ends of this combined assembly is a circuit board with two spring clamp sets respectively placed to meet the electrical coupling of plug-in connectors which are to be hereto joined. The connection block and the circuit board are so aligned in respect to one another that they can be housed within two-part coupling blocks, whereby, accordingly, the circuit board also extends beyond the coupling block at both ends.

A plug-in coupler of this essentially two-part coupling block and housing design represents the necessarily opposing, but complementary female part to match a plug-in connector in accord with the description of claim 1.

Advantageously, the connection block has within its axial bores, plastic, metal or ceramic cylindrical shells order to increase the precision of the guidance of confronting ends of the light conductors to be inserted therein. The said shells are secured in place.

The half-blocks used in the plug-in coupling are advantageously aligned in respect to one another by means of being affixed by blind bores in one half-block which receive complementary positioning prongs from the matching half-block. The employed circuit board has, on both sides of the board, soldered spring clamp sets for the securement of conduction paths of the plug-in connectors which are to be thereto connected. The spring clamp sets on both ends of the circuit board are appropriately cross-connected with one another. Alternative to such conductor paths on the circuit board, that the spring clamp sets can be interconnected by means of wire connections.

The invented plug-in connector system, created from a plug-in connector in accord with claim 1 and a plug-in coupling as described in claim 9, can be made a part of a mixed network with great advantage. This advantage is attributable to the fact that, in particular, hybrid cable can function by means of only a single plug-in procedure while carrying both electrical circuitry as well as light-conducting means. Contrary to the conventional plug-in connector, which is designed to operate either only with light conduction means or as a conventional RJ45 copper cable plug-in system with added receptacles for light-conducting fibers, the invented plug-in arrangement is compatible with other copper systems, which individually require only a very small installation space and enable a secure connection and respond well to high operative demands. The invented plug-in connections can be made on the site since no special tools are required. Because of the modular assembly, the invented plug-in arrangement can also be repaired and maintained in the location of operation.

DESCRIPTION OF THE DRAWINGS

The invention is more closely described and explained with the aid of drawings of two embodiment examples. There is shown in:

FIG. 1 A plug-in connector of the invented type in a perspective view,

FIG. 2 A plug-in connector such as shown in FIG. 1 with its housing removed,

FIG. 3 A plug-in connector as in FIG. 2 with its connection cable removed,

FIG. 4 A plug-in connector in accord with FIG. 3 without an auxiliary housing,

FIG. 5 A circuit board for installation in a plug-in connector such as in FIG. 1, FIG. 6 A plan view of a circuit board showing a ladder circuit, FIG. 7 A plan view onto a circuit board, FIG. 8 A perspective view of a female coupling to receive a plug in unit, FIG. 9 A plug-in coupling with a first housing half removed, FIG. 10 A plug-in coupling without a housing, FIG. 11 An arrangement of a half-block with respect to a circuit board, FIG. 12 A circuit board with a presentation of cylindrical shells, FIG. 13 A circuit board, FIG. 14 A first view onto a circuit board, and FIG. 15 A second view onto a circuit board.

DESCRIPTION OF PREFERRED EMBODIMENTS

Figures 14, 15:
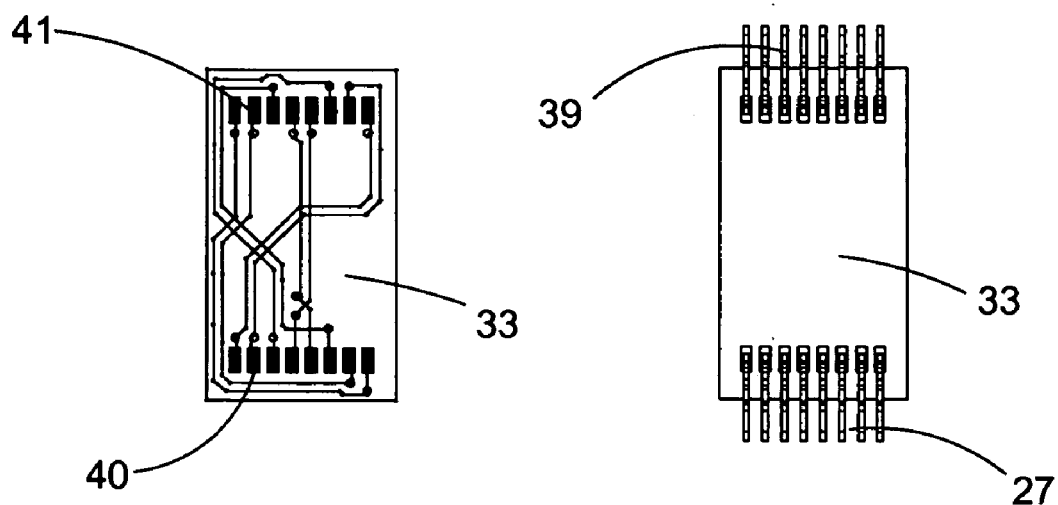

The plug-in connector 1 shown in FIG. 1 has a housing, which consists of two thin-walled encasements 4 and 5, fastened together by interlocking projections and receivers. On the rear end, as depicted in the figures, of the housing encasements 4 and 5 is to be found a threaded joint 3 for securing the hybrid cable 2, which cable has connection extending into the housing. Extending forward, and projecting out of the box-shaped housing, is attached an auxiliary housing 6, which encases an RJ45 connector jack arrangement. Within this auxiliary housing 6 are located penetrating openings 9 that run parallel to the longitudinal axis of the auxiliary housing. These penetrating openings 9 form side-by-side disposed openings for the connection of spring clamp sets of a bushing or a coupling. On the end face thereof are seen two light-conducting lines 7 and 8 also projecting from the auxiliary housing. On the underside of the auxiliary housing is found the conventional securement for the RJ45 connector jack locking assembly, namely as a projection 10.

FIG. 2 is a view similar to FIG. 1, with the housing encasements 4 and 5 removed. This drawing emphasizes that the hybrid cable 2 has, in parallel arrangement, an electrical conductor set 12 as well as light-conducting fibers 7 and 8. The electrical conductors 12 run to electrical bindings that are contactingly attached underneath the pressure-connecting block 13.

Now considering FIG. 3, the plug-in connector is presented in a view with removed conductors, so that the projecting light-conducting lines 7 and 8 are emphasized, which lie in the area of the plug-in connector. These projecting light-conducting lines 7 and 8 are circumferentially encased in ceramic cylindrical shells 15 and 16. The hybrid cable can be affixed on the plug-in connector by means of a clamping ring 14 and the screwed-on joint 3 (not shown on FIG. 3).

The auxiliary housing 6 exhibits on its upper side, beside the penetrations 9 and located to the rear, two openings 42 and 43 into which extend spring clamps which are a part of the connection block 11 (FIG. 4) that is fitted into the auxiliary housing 6. With this arrangement, the auxiliary housing 6 is securely, enclosingly anchored about the said connection block 11.

In more detail in FIG. 4, the connection block 11 is shown with circuit board 18 placed thereon. The circuit board 18 lies on a top side of the box-like connection block 11 and has openings 21 and 22 through which holding detents in the connection block 11 penetrate. The connection block has two longitudinal bores for receiving the light conduction lines.

FIG. 5 shows the circuit board 18 as it appears freed of connections. This circuit board can be constructed in one or more layers.

Figures 6, 7:
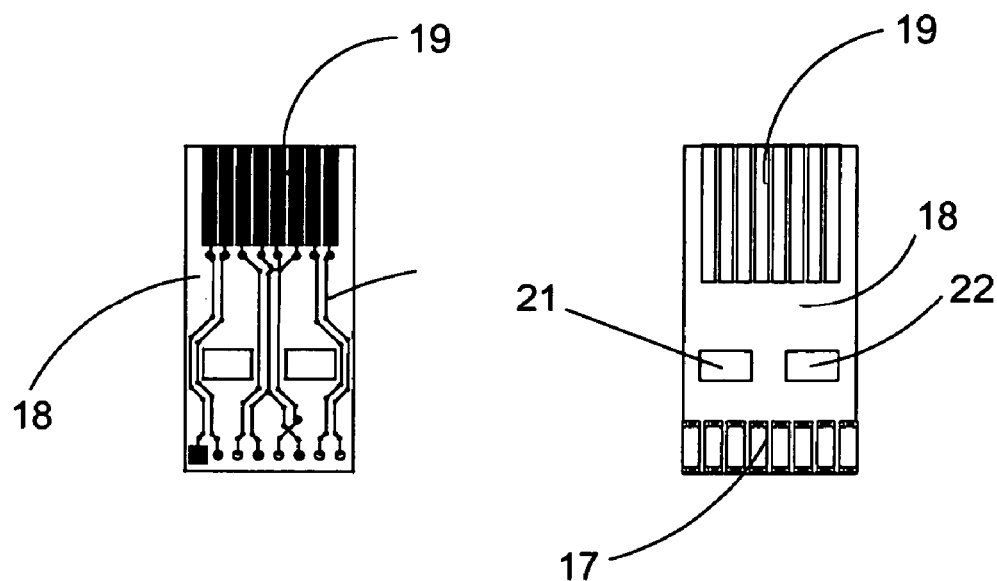

FIG. 6 shows the circuit board 18 in plan view emphasizing the ladder-diagrammed circuitry 20 and contact surfaces 19. A corresponding view is given by FIG. 7 with the blade clamps 17.

The mounting of a plug-in connector system is carried out as follows: the hybrid cable with the exposed electrical and light conductors is first passed through the screw-on joint 3 and the clamping ring 14. Next, the ends of the light-conducting fibers are so inserted into the bores, which are protected with the cylindrical shells 15 and 16, that the said ends extend about 1 cm out of the forward end of the connection plug unit. Now the circuit board 18 is set upon the top of the connection block 11 allowing the circuit board to be frictionally or mechanically attached to the connection block 11, or even adhesively affixed or welded thereto.

In a subsequent step, the electrical conductor 12 is placed on the blade clamp 17, which is disposed on the top side of the circuit board 18. Twisted pairs, which are not required, can be so combined through bridges within an established codification that at a subsequent time, an identification of the wiring state is possible. Such an identification can also be exhibited by means of a chip on the circuit board of the plug-in unit, for instance by a Codification Chip or another type of data providing chips. This arrangement can communicate with a control intelligence in a downstream control circuit.

The clamping of the electrical line 12 with the blade clamps is carried out by the placing of a plastic pressure block 13 laid transversely over the blade clamps 17 and which pressure block has recesses to accommodate the clamps 17. The electrical conductors within the blade clamps are securely affixed by applying force to the pressure block 13.

In the next action, the auxiliary housing 6, which contains both the openings 9 for the contacting of the electrical connection and also the front openings for the passage of the light conductor, is slidingly set on the connection block 11. The retaining projections of the connection block 11 reach through the openings 21 and 22 of the circuit board 18 into the openings 42 and 43 of the auxiliary housing 6 and anchor this with the connection block 11.

Finally, the components 4 and 5, which form a first housing, are placed encompassingly around the plug-in connection. These components 4 and 5 contain, when assembled, a reverse partial threading upon which the screw-on connection 3 can be threadedly united. When this is done, the ring-clamp 14 affixes the hybrid cable 2 and relieves the line tension therefrom.

The invented employment of the a circuit board in the plug-in unit leads to a compact assembly, wherein electrical contacting at the back of the plug-in unit becomes possible while at the oppositely situated forward end, the unit may receive an RJ45 connector jack which functions with both the electrical connections as well as the light conduction means. This circuit board, then, serves simultaneously the connection of the electrical conductor as well as the furnishing of the contact surfaces for the functioning of the spring clamp sets of a bushing or of a coupling.

The housing elements can consist of plastic or metal, or may be metallized, to provide a strong resistance to radiation interference.

FIG. 8 shows a coupling 24, namely a female fitting, for the joining of two lengths of cable, which can be a part of a plug-in device in accord with FIG. 1. The coupling 24 is housed in two housing-halves 25 and 26, which are provided with recesses 28 and 29, which represent a conventional type of RJ45 jack-bushing device.

The coupling 24 contains electric spring clampings 27 for the contacting of electrical connections of an electrical cable which may be connected thereto.

FIG. 9 shows a plug-in coupling, wherein the otherwise present housing-half 25 has been removed. With this removal, it may be seen that the half-block 32 contains two openings 30 and 31. Underneath the said half-block 32 is to be found a circuit board 33 upon which a spring connector set has been placed.

In FIG. 10 is exhibited two mutually confronting half-blocks 32 and 33, again with the circuit board 33 set thereunder.

FIG. 11 shows the circuit board 33 with only one half-block 34. The half-blocks 32 and 34 are shown in FIGS. 10 and 11. The half-block 34 has two aligning prongs 37 and 38 which engage in two complementary, oppositely opposed bores (not seen in the figure) of the half-block 32 and thereby, the half-blocks 32 and 34 bind themselves securely together. The half-block 34 also has a corresponding bore 33a in which a projecting rod of the half-block 32 can be inserted.

The half-blocks 32 and 4 include, respectively, two aligned, matching bores and projecting, hollow cylindrical tubes, which are conductor-protective cylindrical shells 35 and 36, emerging from the half-block 32 in openings 30, 31 into which light-conductors, which are part of the plug-in units as shown in FIG. 1, are to be inserted. In this way, assurance is provided that the light conductors confront one another precisely in an end-to-end manner. The cylindrical shells can consist of plastic, metal or ceramic materials and may also be slotted in order to permit glass or plastic conductors which are secured on a ferrule to be properly aligned in their attached position.

FIG. 12 shows the cylindrical shells 35, 36 in a free float above the circuit board 33. The circuit board 33 is shown again in FIG. 13 and indicates two spring clamps or spring connectors 27 and 39 placed on each end thereof for the purpose of meeting the contact surfaces of a plug-in connector in accord with FIG. 6.

FIGS. 14 and 15 are plan views showing circuit board 33. FIG. 14 in particular exhibits the ladder type layout on the circuit board 33 for the connection of the soldering points 40 and 41. To enable cross-over wiring, the circuit board is built in multiple layers.

FIG. 15 schematically outlines the circuit board 33 with extended spring connections 27 and 39.

Further, the coupling can receive such spring connections at the circuit board as may be codified.

Mounting the plug-in coupling is done in this manner: A circuit board is provided in accord with FIG. 13, together with both half-blocks 32, 34, which have been previously connectingly joined and provided with the cylindrical shells 35 and 36, which are inserted into the housing-halves 26 and 25. The housing-halves are, in a customary manner, frictionally held together or fastened by adhesive. Since the block-halves, respectively, are constructed in the manner of an RJ45 bushing, it is obviously possible that they can be united in the plug-in bushing by a normal RJ45 Patch Cable as well as a plug-in connector, in accord with FIG. 1.

The above describes specially selected embodiments; however, the scope of the invention is not limited thereby. The connection of the individual elements of the plug-in connectors and couplings can also be realized in other ways. Some of these ways can be typified by adhesive means, welding, screwing or corresponding connection elements. Certain connection elements which have been shown as capable of being part of the assembly, such as, for example, the half-blocks 32 and 34, can also be manufactured in a one-piece form. Not only the plug-in connector as shown in FIG. 1, but also the plug-in coupling in accord with FIG. 8, can show codifications labels, for identification of the plug-in coupling. Also, the plug-in coupling can be metallized or equipped with metal block-halves, in order to acquire a better protection from stray radiation.

The cables, which will be necessary in the complete wiring, are especially hybrid type cables. The principal concept of the invention is valid also in a case of separately running electrical and light- conductors, which may have been originally within the plug-in connector.

The invention is claimed is:

1. A plug-in connector incorporating an RJ45 connection jack for a data transmission cable (2), in particular, a hybrid cable, with at least one light conductor (7, 8) and electrical lines (12) parallel therewith, with a connection block (11) securing at least one end of the of the light conductor (7, 8) and with electrical contacts (18) as well as a housing (4, 5) for encasement of the said connection block (11) and its contacts, characterized in that
    the housing contains the said rectangular connection block (11), which has at least two openings for the passage of at least two light conductors (7, 8), and
    one circuit board (18) is provided with connecting elements for the connection of the electrical conductor (12) of the data cable, and
    the circuit board (18) is connected at one end of the connection block, and
    the circuit board has parallel arranged contact strips (19), which are accessible for subsequently insertable electrical connections, by means of penetrative recesses (9) of an auxiliary housing (6), which encapsulates the connection block (11) and the circuit board (18).

2. A plug-in connector in accord with claim 1, characterized in that the circuit board (18) includes blade clamps (17) for securement of the electrical lines (12).

3. A plug-in connector in accord with claim 2, characterized in that the electric conductors, which are aligned in parallel to the blade clamps (17) can be mutually pressed into conducting position into the blade clamps by means of a pressure block transversely bridging across the conductors, wherein said pressure block possesses parallel open recesses which conform to the said blade clamps (17).

4. A plug-in connector in accord with claim 1, characterized in that the auxiliary housing (6) includes open recesses (40, 41) for the mechanical arresting of the connection block (11) by means of spring projections.

5. A plug-in connector in accord with claim 1, characterized in that the recessed openings of the connection block are fitted with plastic, metal or ceramic cylindrical shells (15, 16) for the guidance of the light conductor ends (7, 8).

6. A plug-in connector in accord with claim 1, characterized in that the housing (4, 5) is of multipart construction and includes a cable clamping joint (3).

7. A plug-in connector in accord with claim 1, characterized in that the auxiliary housing (6) is designed with a locking apparatus (10) for the connection with an RJ45bushing.

8. A plug in connector in accord with claim 1, characterized in that the circuit board is constructed as one piece in combination with the connection block.

9. A plug-in coupling incorporating an RJ45connection jack for the reception of two plug-in connectors for the connective binding of two data cables, especially hybrid cables with, respectively, at least one light conductor along with electrical lines running parallel thereto, with a connection block for the ends of the light conductors and with electrical contacts, as well as a coupling block, characterized in that
    a generally rectangular connection block, formed from two half-blocks (32, 34) set opposingly end to end against one another and provided with two axial bores (30, 31) for the reception and alignment of the light conductor, which is to be attached, and
    on the outside of the connection block (34) is provided a circuit board (33) with two spring clamps (27, 39) respectively arranged on each end thereof for electrical connecting to plug-in units which are to be attached thereto, and
    the connection block and the circuit board (33) are combined with one another and encompassed in a two-part housing block (25, 26), and
    the circuit board (33) extends itself beyond the connection block (11) at both ends.

10. A plug-in coupling in accord with claim 9, characterized in that the coupling block, within said axial bores (30, 31), is furnished with cylindrical shells of plastic, metal, or ceramic materials.

11. A plug-in coupling in accord with claim 9, characterized in that the coupling half-blocks (32, 34) align themselves respectively to one another by means of complementary projections and bores which mutually join.

12. A plug-in coupling in accord with claim 9, characterized in that the spring clamps (27, 39) are soldered upon the circuit board.

13. A plug-in connector in accord with claim 1, characterized in that
    the circuit board is furnished with a Coded Circuit, which identifies the plug-in connector and/or its electrical conductor, and
    the Coded Circuit can be interrogated by means of an evaluation device.

14. A plug-in coupling in accord with claim 9, characterized in that
    the circuit board is furnished with a Coded Circuit, which identifies the plug-in connector and/or its electrical conductor, and
    the Code Circuit can be interrogated by means of an evaluation device.

15. A plug-in connector in accord with in accord with claim 2, characterized in that the housing (4, 5) is of multipart construction and includes a cable clamping joint (3).

16. A plug-in connector in accord with in accord with claim 3, characterized in that the housing (4, 5) is of multipart construction and includes a cable clamping joint (3).

17. A plug-in connector in accord with in accord with claim 4, characterized in that the housing (4, 5) is of multipart construction and includes a cable clamping joint (3).

18. A plug-in connector in accord with in accord with claim 5, characterized in that the housing (4, 5) is of multipart construction and includes a cable clamping joint (3).

* * * * *